United States Patent
Jousselin

(10) Patent No.: US 9,791,311 B2
(45) Date of Patent: *Oct. 17, 2017

(54) ROTATING BLADE ANALYSIS

(71) Applicant: Rolls-Royce PLC, London (GB)

(72) Inventor: Olivier Jousselin, Bristol (GB)

(73) Assignee: Rolls-Royce PLC, London (GB)

( * ) Notice: Subject to any disclaimer, the term of this patent is extended or adjusted under 35 U.S.C. 154(b) by 905 days.

This patent is subject to a terminal disclaimer.

(21) Appl. No.: 13/950,431

(22) Filed: Jul. 25, 2013

(65) Prior Publication Data
US 2013/0311156 A1   Nov. 21, 2013

Related U.S. Application Data

(63) Continuation of application No. 13/049,297, filed on Mar. 16, 2011, now Pat. No. 8,521,493.

(30) Foreign Application Priority Data

Mar. 19, 2009 (GB) .................................. 1004559.9

(51) Int. Cl.
G06G 7/48 (2006.01)
G01H 1/00 (2006.01)
G06F 17/50 (2006.01)

(52) U.S. Cl.
CPC ......... G01H 1/006 (2013.01); G06F 17/5009 (2013.01)

(58) Field of Classification Search
CPC ............................. G01H 1/006; G06F 17/5009
(Continued)

(56) References Cited

U.S. PATENT DOCUMENTS 4,060,329 A   11/1977   Ellis
4,518,917 A    5/1985   Oates et al.
(Continued)

FOREIGN PATENT DOCUMENTS

EP   2065567 A2   6/2009
EP   2136189 A2   12/2009
(Continued)

OTHER PUBLICATIONS

European Search Report dated Jul. 21, 2011 from corresponding European Patent Application No. 11155728.

*Primary Examiner* — David Silver
(74) *Attorney, Agent, or Firm* — Grogan, Tuccillo & Vanderleeden, LLP

(57) ABSTRACT

Methods are provided for: (i) measuring the position of the blade stagger angle axis for one or more blades of a row of blades attached to a rotor, (ii) measuring the blade tip stagger angle for one or more such blades, and (iii) measuring the blade tip axial displacement for one or more such blades. The methods use forward and rearward blade tip timing datasets for successive rotations of the blades from two axially spaced blade tip timing probes. The forward probe is forward of the rearward probe along the axial direction of the rotor. The blade tip timing datasets allow the times of arrival of the blades at the respective probes to be measured. The methods also use a once per revolution dataset for the successive rotations of the blades. The once per revolution dataset allows the angular velocity of the blades to be measured.

24 Claims, 5 Drawing Sheets

(58) Field of Classification Search
    USPC .................................................. 703/1, 2, 6–8
    See application file for complete search history.

(56) References Cited

U.S. PATENT DOCUMENTS

| | | |
|---|---|---|
| 4,616,932 A | 10/1986 | Parker |
| 4,790,189 A | 12/1988 | Twerdochlib |
| 4,887,468 A | 12/1989 | McKendree et al. |
| 4,934,192 A | 6/1990 | Jenkins |
| 4,951,500 A | 8/1990 | Twerdochlib et al. |
| 2006/0088414 A1 | 4/2006 | Harivel et al. |
| 2007/0132461 A1 | 6/2007 | Holmquist et al. |
| 2009/0078053 A1 | 3/2009 | Twerdochlib |
| 2011/0231171 A1* | 9/2011 | Jousselin ............... G01H 1/006 703/7 |
| 2014/0126993 A1* | 5/2014 | Leroux ................. F01D 21/003 415/1 |

FOREIGN PATENT DOCUMENTS

| | | |
|---|---|---|
| FR | 2646468 A1 | 4/1989 |
| FR | 2714171 A1 | 12/1993 |
| GB | 2181246 A | 4/1987 |
| GB | 2211603 A | 7/1989 |
| GB | 2344177 A | 5/2000 |
| GB | 2374670 A | 10/2002 |

\* cited by examiner

ROTATING BLADE ANALYSIS

CROSS REFERENCE TO RELATED APPLICATION

This application is a continuation of pending U.S. patent application Ser. No. 13/049,297 filed Mar. 16, 2011 entitled "ROTATING BLADE ANALYSIS", which is hereby incorporated by reference in its entirety.

FIELD OF THE INVENTION

The present invention relates to the analysis of rotating blades, such as those found in gas turbine engines.

BACKGROUND OF THE INVENTION

In the development of gas turbine engines, it is important to determine the amount of vibration of the rotating blades. From vibration measurements, stresses induced in the blades may be determined. Action can then be taken to avoid stresses, which are high enough to cause damage to the blades.

A technique for characterising blade vibration is "blade tip timing" (BTT) in which non-contact timing probes (e.g. capacitance or optical probes), typically mounted on the engine casing, are used to measure the time at which a blade passes each probe. This time is compared with the time at which the blade would have passed the probe if it had been undergoing no vibration. This is termed the "expected arrival time" and can be calculated from the rotational position of the particular blade on the rotor in conjunction with a "once per revolution" (OPR) signal which provides information about the position of the rotor. The OPR signal is derived from the time at which an indicator on the rotor passes a reference sensor, and its use is well known in the art.

The difference between the expected arrival time and the actual arrival time can be multiplied by the blade tip velocity to give the displacement of the blade from its expected position. Thus BTT data from a particular probe effectively measures blade tip displacement at the probe.

Advantageously, the tip timing method does not require a telemetry system since the probes are mounted on the casing. However, because the sampling rate of the probes is determined by the rotational frequency of the rotor, it is often below the Nyquist frequency for the vibrations of interest. Thus each probe undersamples the vibrations, leading to problems such as aliasing. A further problem with BTT data is that it is often intrinsically noisy due to probe movement caused by mounting restrictions and casing thickness. Nonetheless, with a plurality of timing probes, it is possible, in principle, to perform useful vibration analysis that can be converted into blade stresses.

SUMMARY OF THE INVENTION

The present invention is at least partly based on a realisation that BTT data can be used to extract further useful information about rotating blades.

The external shape of blades, such as fan blades, can be defined by a series of aerofoil sections at different radial positions along the blade. These sections can have respective stagger angles (i.e. the angle between the chord at a particular section and the axial direction of the rotor), which increase with increasing radial position. Due to operating loadings such as centrifugal and aerodynamic forces, the blades can "unwind" in use, producing changes to the stagger angles. At the tip of a blade, this variation in stagger angle can be considered as a rotation of the chord at the tip about a blade stagger angle axis, which extends in a radial direction of the rotor. To understand blade behaviour during operation, it would be desirable to be able to determine the instantaneous position of the blade stagger angle axis for a given blade. Similarly, it would be desirable to be able to determine the instantaneous blade stagger angle at the tip of a given blade.

Thus a first aspect of the invention provides a method of measuring the position of the blade stagger angle axis for one or more blades of a row of blades attached to a rotor, the method includes the steps of:

providing forward and rearward blade tip timing datasets for successive rotations of the blades from two axially spaced blade tip timing probes, the forward probe being forward of the rearward probe along the axial direction of the rotor, the blade tip timing datasets allowing the times of arrival of the blades at the respective probes to be measured;

providing a once per revolution dataset for said successive rotations of the blades, the once per revolution dataset allowing the angular velocity of the blades to be measured;

determining, from the forward and rearward blade tip timing datasets, the measured blade tip times of arrival at the forward and rearward probes of a blade for a reference revolution of the blades;

determining, from the once per revolution dataset, predicted blade tip times of arrival at the forward and rearward probes of the blade for a further revolution of the blades on the assumption that there is no change in shape or relative position of the blade;

determining, from the forward and rearward blade tip timing datasets, the measured blade tip times of arrival at the forward and rearward probes of the blade for said further revolution of the blades;

calculating the position of the blade stagger angle axis at said further revolution from the expression:

$$D_{FA}=D_{FR}(\Delta_F/(\Delta_F+\Delta_R))$$

or from the expression:

$$D_{RA}=D_{FR}(\Delta_R/(\Delta_F+\Delta_R))$$

where $D_{FA}$ is the distance along the axial direction of the rotor between the forward probe and the position of the blade stagger angle axis, $D_{RA}$ is the distance along the axial direction of the rotor between the rearward probe and the position of the blade stagger angle axis, $D_{FR}$ is the distance along the axial direction of the rotor between the forward probe and the rearward probe, $\Delta_F$ is the difference between the measured time of arrival at the forward probe and the predicted time of arrival at the forward probe for said further revolution, and $\Delta_R$ is the difference between the measured time of arrival at the rearward probe and the predicted time of arrival at the rearward probe for said further revolution.

A second aspect of the invention provides a method of measuring the blade tip stagger angle for one or more blades of a row of blades attached to a rotor, the method includes the steps of:

providing forward and rearward blade tip timing datasets for successive rotations of the blades from two axially spaced blade tip timing probes, the forward probe being forward of the rearward probe along the axial direction of the rotor, the blade tip timing datasets allowing the times of arrival of the blades at the respective probes to be measured;

providing a once per revolution dataset for said successive rotations of the blades, the once per revolution dataset allowing the angular velocity of the blades to be measured;

determining, from the forward and rearward blade tip timing datasets, the measured blade tip times of arrival at the forward and rearward probes of a blade for a revolution of the blades;

calculating the blade tip stagger angle of the blade at said revolution from the expressions:

$$\theta = a\tan((R((\alpha_F - \alpha_R) - \Delta_\alpha))/D_{FR})$$

and $$\Delta_\alpha = \omega(T^m{}_F - T^m{}_R)$$

where $\theta$ minus the blade tip stagger angle of the blade at said revolution, $D_{FR}$ is the distance along the axial direction of the rotor between the forward probe and the rearward probe, $R$ is the radial distance from the tip of the blades to the axis of the rotor, $\alpha_F$ is the angular position of the forward probe, $\alpha_R$ is the angular position of the rearward probe, $\omega$ is the measured angular velocity of the blades at said revolution, $T^m{}_F$ is the measured time of arrival of the blade at the forward probe at said revolution, and $T^m{}_R$ is the measured time of arrival of the blade at the rearward probe at said revolution.

Thus, by using blade tip timing data, it is possible to measure the instantaneous position of the blade stagger angle axis and/or to measure the instantaneous blade tip stagger angle for a particular blade. Advantageously, these measurements can be used in subsequent analyses. In particular, they can be used to determine the instantaneous blade tip axial displacement, i.e. displacement of the tip of the blade in the axial direction of the rotor. This displacement can be caused by operating loadings (e.g. centrifugal and aerodynamic forces) and/or by axial movement of the entire blade relative to the rotor, for example by sliding of a fan blade along its dovetail root fixing. Further, measurement of the stagger angle enables modellers to confirm the measurements of blade unwind against (e.g. finite element) model predictions.

Accordingly, a third aspect of the invention provides a method of measuring the blade tip axial displacement for one or more blades of a row of blades attached to a rotor, the method includes the steps of:

performing the method of the first aspect to measure the position of the stagger angle axis of a blade at said further revolution of the blades;

performing the method of the second aspect to measure the blade tip stagger angle for the blade at said reference revolution of the blades;

performing the method of the second aspect to measure the blade tip stagger angle for the blade at said further revolution;

determining updated predicted blade tip times of arrival at the forward and rearward probes of the blade for said further revolution from the expressions:

$$T^p{}_{F,fur} = T^m{}_{F,ref}(\omega_{ref}/\omega_{fur} - D_{FA,fur}(\tan(\theta_{fur}) - \tan(\theta_{ref}))/(R\omega_{fur})$$

and $$T^p{}_{R,fur} = T^m{}_{R,ref}(\omega_{ref}/\omega_{fur} + D_{RA,fur}(\tan(\theta_{fur}) - \tan(\theta_{ref}))/(R\omega_{fur})$$

where $T^p{}_{F,fur}$ and $T^p{}_{R,fur}$ are the updated predicted times of arrival of the blade at respectively the forward and rearward probes at said further revolution and relative to the start of said further revolution, $T^m{}_{F,ref}$ and $T^m{}_{R,ref}$ are the measured times of arrival of the blade at respectively the forward and rearward probes at said reference revolution and relative to the start of said reference revolution, $\omega_{ref}$ and $\omega_{fur}$ are the measured angular velocities of the blades at respectively said reference revolution and said further revolution, $D_{FA,fur}$ and $D_{RA,fur}$ are the distances along the axial direction of the rotor between respectively the forward probe and the position of the blade stagger angle axis and the rearward probe and the position of the blade stagger angle axis at said further revolution, and $\theta_{ref}$ and $\theta_{fur}$ are the blade tip stagger angles of the blade at respectively said reference revolution and said further revolution;

and determining the blade tip axial displacement at said further revolution relative to the blade tip axial position at said reference revolution from the expressions:

$$\Delta_{ax} = (2\pi R \Delta t_{cts})/(\omega_{fur} \tan(\theta_{fur}))$$

and $$\Delta t_{cts} = (T^m{}_{F,fur} - T^p{}_{F,fur}) - (T^m{}_{R,fur} - T^p{}_{R,fur})$$

where $\Delta_{ax}$ is the blade tip axial displacement at said further revolution relative to the blade tip axial position at said reference revolution, and $T^m{}_{F,fur}$ and $T^m{}_{R,fur}$ are the measured times of arrival of the blade at respectively the forward and rearward probes at said further revolution and relative to the start of said further revolution.

The blade axial tip displacement measured in this way can be used, for example, in the validation of blade models (e.g. finite element models) and/or in BTT calibration. The displacement can also be used to understand, e.g. engine surge, stall and flutter events, and thus help in engine design.

Advantageously, the forward and rearward blade tip timing datasets and the once per revolution dataset used in the methods of the above aspects can be obtained without fixing probes to the blades. For example, the forward and rearward probes can be mounted on a casing of the rotor.

The method of any one of the first, second and third aspects can be repeated for other blades of the row. The method of any one of the first, second and third aspects may include an initial step of generating the forward and rearward blade tip timing datasets and the once per revolution dataset. For example, the forward and rearward blade tip timing datasets can be generated by detecting the times at which the blades pass the forward and rearward probes. The once per revolution dataset can be generated by detecting the times at which a marker on the rotor passes a once per revolution probe.

The method of any one of the first, second and third aspects may have any one or any combination of the following optional features. The blade may be a fan blade. The forward probe is typically at a position which is swept by the leading edges of the blades. The rearward probe is typically at a position which is swept by the trailing edges of the blades. The reference rotation may conveniently be the first rotation of the rotor.

Further aspects of the present invention provide: (i) use of the method of any one of the first, second and third aspects for validating a model (e.g. a finite element model) of the blades, (ii) use of the method of any one of the first, second and third aspects for calibrating blade tip timing data, and (iii) use of the method of any one of the first, second and third aspects for characterisation of surge, stall and/or flutter events.

Typically, the methods of the first, second and third aspects are computer-based methods. Further aspects of the present invention provide: (i) a computer-based system for performing the method of any one of the first, second and third aspects, (ii) a computer program for performing the method of any one of the first, second and third aspects, and (iii) a computer program product carrying a program for performing the method of any one of the first, second and third aspects.

DETAILED DESCRIPTION OF THE PREFERRED EMBODIMENTS

Figure 1:
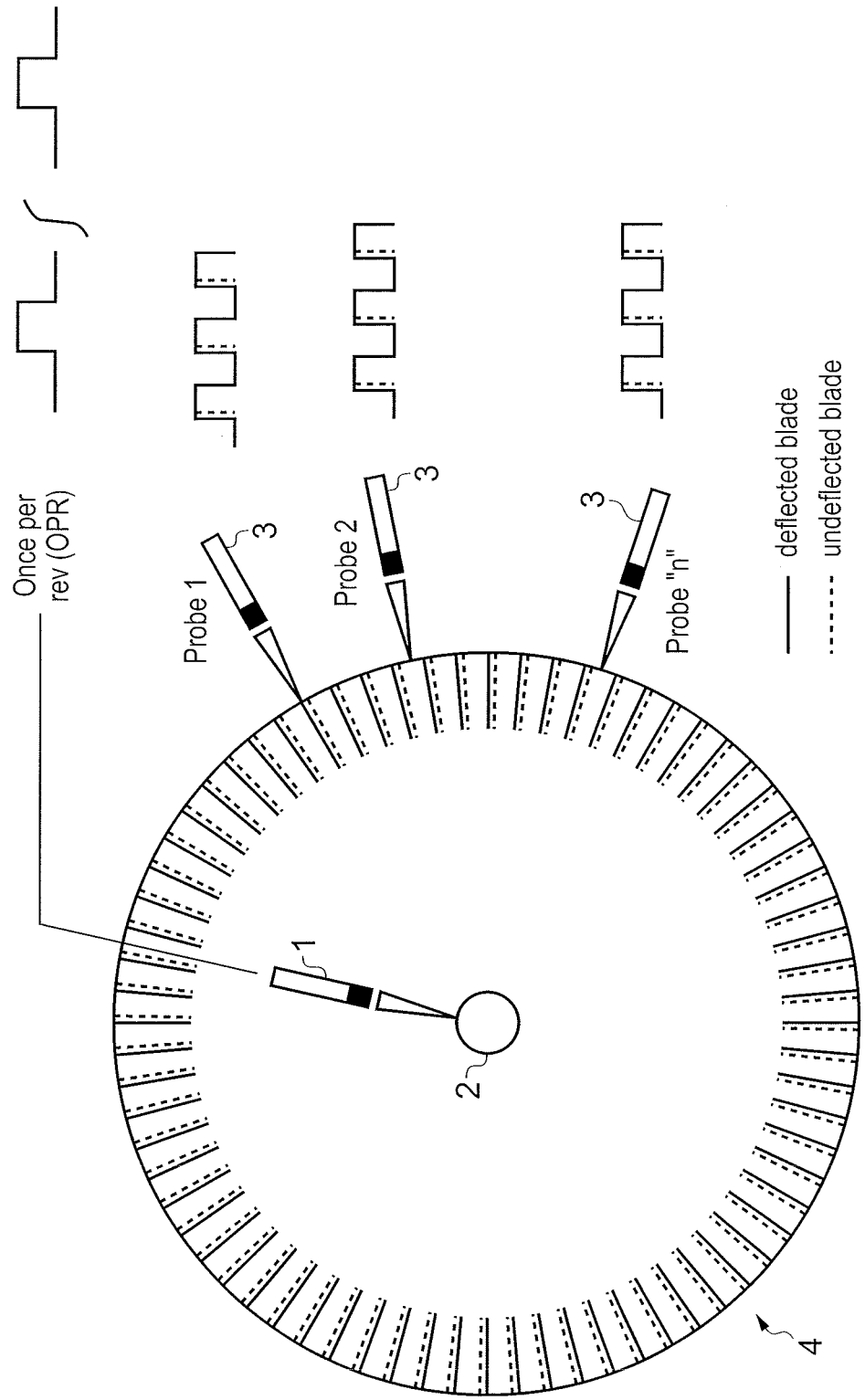
FIG. 1 shows schematically a BTT arrangement.

FIG. 1 shows schematically a BTT arrangement. An OPR probe 1 monitors the position of rotor 2, while 1 to n BTT probes 3 provide timings for blades 4 mounted to the rotor.

Figure 2:
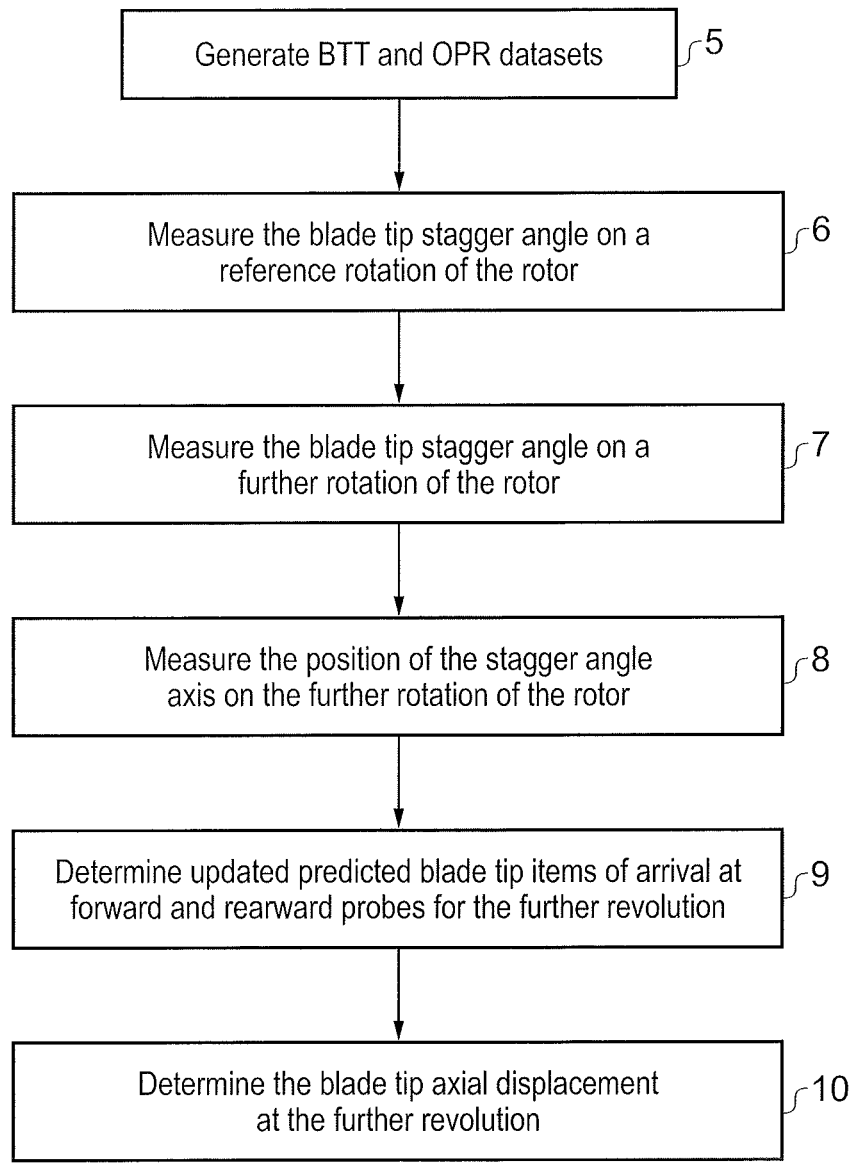
FIG. 2 is a flow chart showing procedural steps in a method of measuring the blade tip axial displacement of a blade of a row of blades attached to a rotor.

FIG. 2 is a flow chart showing procedural steps in a method of measuring the blade tip axial displacement of a blade of a row of blades attached to a rotor.

In a first step 5, BTT datasets are generated for (i) a forward BTT probe positioned so that it is swept by the leading edges of a row of blades over successive rotations of the blades and (ii) a rearward BTT probe positioned so that it is swept by the trailing edges of the blades over the rotations. An OPR dataset is also generated for the successive rotations. The data in the datasets do not have to be filtered. In a next step 6, the datasets are used to measure the blade tip stagger angle for one of the blades and on a reference rotation (conveniently the first rotation) of the blades. At step 7, the datasets are used to measure the blade tip stagger angle for the blade on a further rotation of the blades. At step 8, the datasets are used to measure the position of the stagger angle axis of the blade at the further revolution. At step 9, the blade tip stagger angles and the position of the stagger angle axis are used to determine predicted blade tip times of arrival at the forward and rearward probes for the further revolution. Finally, at step 10, the predicted blade tip times of arrival are used to determine the blade tip axial displacement at the further revolution.

Figure 3:
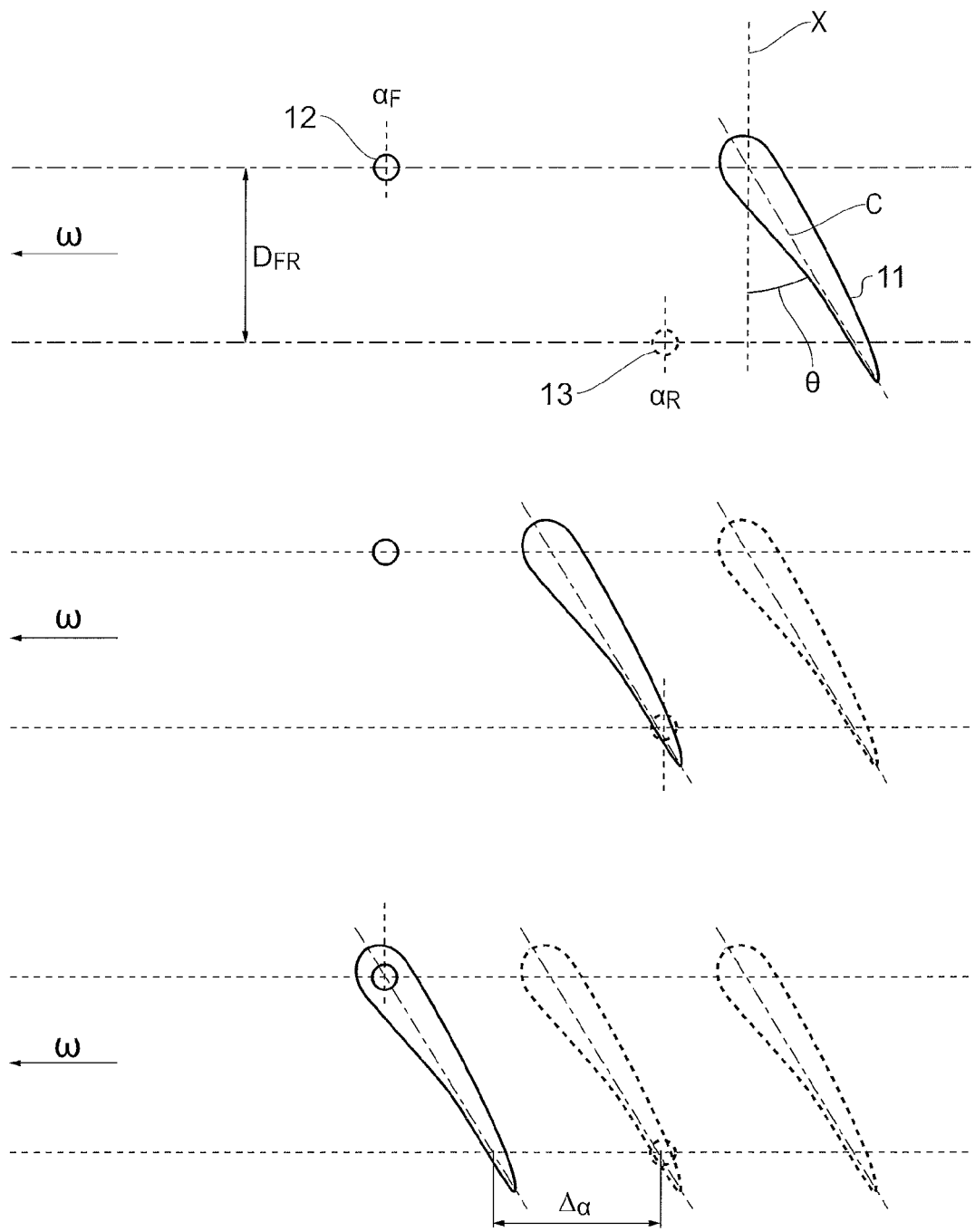
FIG. 3 shows schematically the measurement of the blade tip stagger angle if the blade at either a reference or a further rotation.

Returning to steps 6 and 7, FIG. 3 shows schematically the measurement of the blade tip stagger angle at either the reference or further rotation. A blade tip 11 sweeps at an angular velocity $\omega$ passed the forward probe 12 at angular position $\alpha_F$ and rearward probe 13 at angular position $\alpha_R$, the distance along the axial direction of the rotor between the forward and rearward probes being $D_{FR}$. The angular shift $\Delta_\alpha$ of the leading or trailing edge of the blade between the arrivals at the forward and rearward probes is then:

$$\Delta_\alpha = \omega(T^m_F - T^m_R)$$

where $T^m_F$ is the measured time of arrival of the blade at the forward probe from the forward probe BTT dataset, and $T^m_R$ is the measured time of arrival of the blade at the rearward probe from the rearward probe BTT dataset. The blade tip stagger angle $\theta$, i.e. the angle between the chord C of the aerofoil section at the blade tip 11 and the axial direction X of the rotor, is then calculated for the particular revolution from the expression:

$$\theta = a\tan((R((\alpha_F - \alpha_R) - \Delta_\alpha))/D_{FR})$$

where R is the radial distance from the tip of the blades to the axis of the rotor.

Figure 4:
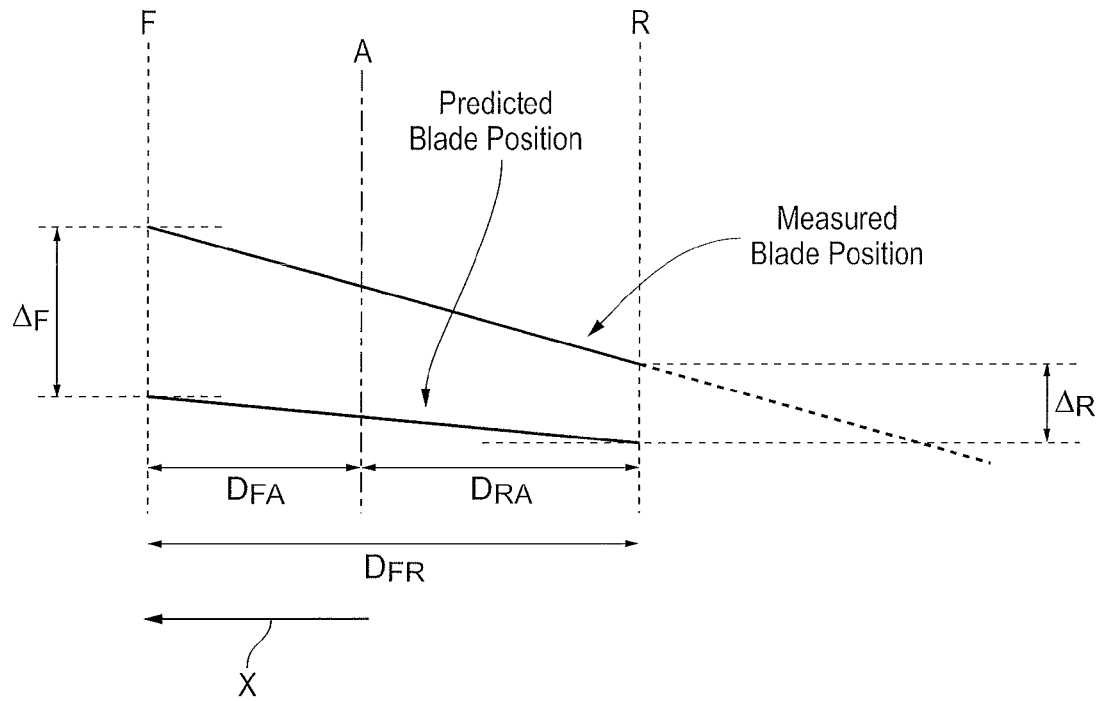
FIG. 4 shows schematically the measurement of the stagger angle axis of the blade at the further rotation.

Turning then to step 8, FIG. 4 shows schematically the measurement of the blade stagger angle axis at the further rotation. On the assumption that there is no change in shape or relative position of the blade (i.e. there are no geometric or aerodynamic changes), predicted blade tip times of arrival at the forward and rearward probes of the blade for the further revolution are calculated from the angular velocity of the blades as measured by the OPR dataset. These predicted blade tip times of arrival are represented in FIG. 4 by a predicted chord position for the blade. The BTT datasets, however, provide the actual measured blade tip times of arrival at the forward and rearward probes of the blade for the further revolution. These measured blade tip times of arrival are represented in FIG. 4 by a measured chord position for the blade. Also shown in FIG. 4 are lines F, R respectively which are the paths swept by the positions on the blade tip corresponding to the forward 12 and rearward 13 probes, and the line S which is the path swept by the position on the blade tip through which the blade stagger angle axis passes The position of line S and hence the position of the blade stagger angle axis is calculated from the expression:

$$D_{FA} = D_{FR}(\Delta_F/(\Delta_F + \Delta_R))$$

or from the expression:

$$D_{RA} = D_{FR}(\Delta_R/(\Delta_F + \Delta_R))$$

where $D_{FA}$ is the distance along the axial direction X of the rotor between the forward probe and the position of the blade stagger angle axis, $D_{RA}$ is the distance along the axial direction of the rotor between the rearward probe and the position of the blade stagger angle axis, $D_{FR}$ is the distance along the axial direction of the rotor between the forward probe and the rearward probe, $\Delta_F$ is the difference between the measured time of arrival at the forward probe and the predicted time of arrival at the forward probe for said further revolution, and $\Delta_R$ is the difference between the measured time of arrival at the rearward probe and the predicted time of arrival at the rearward probe for said further revolution.

Figure 5:
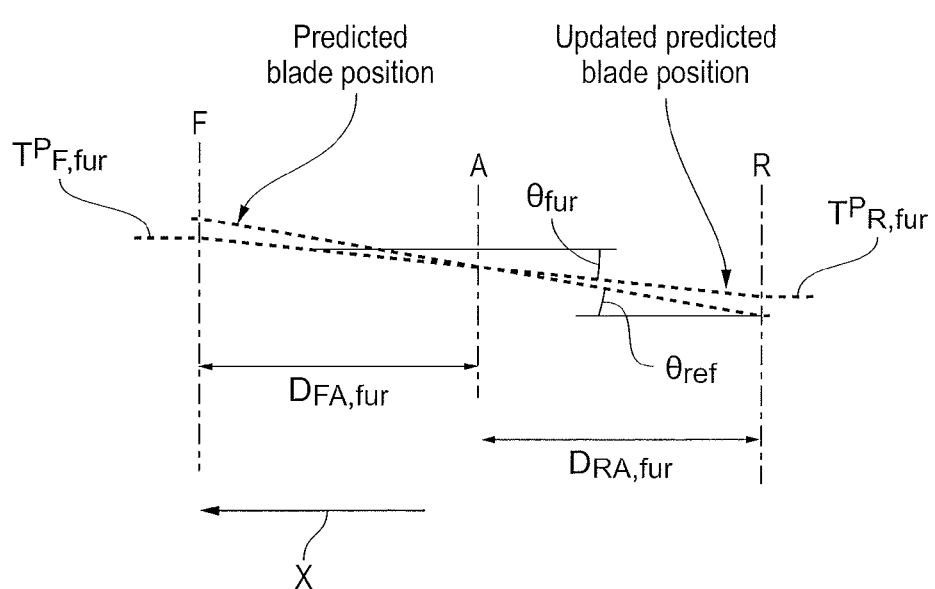
FIG. 5 shows schematically rotation of the blade tip aerofoil section about the blade stagger angle axis.

Turning next to step 9, the blade tip stagger angles at the reference and further rotations and the position of the stagger angle axis at the further rotation are used to establish updated predicted blade tip times of arrival at the forward and rearward probes for the further revolution. More particularly, by knowing the position of the stagger angle axis, the blade tip aerofoil section can be rotated about that axis by an amount corresponding to the change in stagger angle between the reference rotation and the further rotation, as shown schematically in FIG. 5. That is:

$$T^p_{F,fur} = T^m_{F,ref}\omega_{ref}/\omega_{fur} - D_{FA,fur}(\tan(\theta_{fur}) - \tan(\theta_{ref}))/(R\omega_{fur})$$

and $$T^p_{R,fur} = T^m_{R,ref}\omega_{ref}/\omega_{fur} + D_{RA,fur}(\tan(\theta_{fur}) - \tan(\theta_{ref}))/(R\omega_{fur})$$

where $T^P_{F,fur}$ and $T^P_{R,fur}$ are the updated predicted times of arrival of the blade at respectively the forward 12 and rearward 13 probes at the further revolution and relative to the start of the further revolution, $T^m_{F,ref}$ and $T^m_{R,ref}$ are the measured times of arrival of the blade at respectively the forward and rearward probes at the reference revolution and relative to the start of the reference revolution, $\omega_{ref}$ and $\omega_{fur}$ are the measured angular velocities of the blades at respectively the reference revolution and the further revolution, $D_{FA,fur}$ and $D_{RA,fur}$ are the distances along the axial direction of the rotor between respectively the forward probe and the position of the blade stagger angle axis and the rearward probe and the position of the blade stagger angle axis at said further revolution, and $\theta_{ref}$ and $\theta_{fur}$ are the blade tip stagger angles of the blade at respectively said reference revolution and said further revolution.

Figure 6:
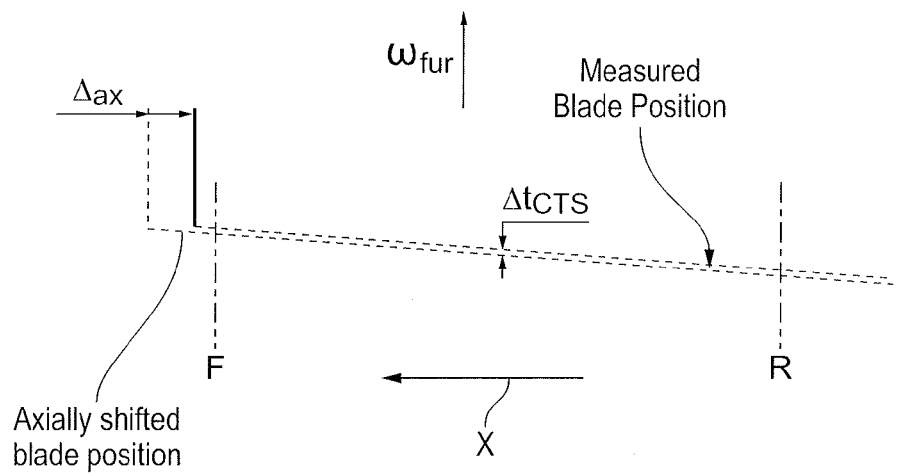
FIG. 6 shows schematically a circumferential time shift of the blade tip and the corresponding blade tip axial displacement.

At step 10, from $T^P_{F,fur}$ and $T^P_{R,fur}$ it is then possible to calculate a circumferential time shift of the blade tip, $\Delta t_{cts}$, from the expression:

$$\Delta t_{cts} = (T^m_{F,fur} - T^P_{F,fur}) - (T^m_{R,fur} - T^P_{R,fur})$$

where $T^m_{F,fur}$ and $T^m_{R,fur}$ are the measured times of arrival of the blade at respectively the forward and rearward probes at said further revolution and relative to the start of said further revolution. The circumferential time shift is based on an assumption that the aero gas loading on each blade is constant from leading to trailing edge. In this case any difference between $(T^m_{F,fur} - T^P_{F,fur})$ and $(T^m_{R,fur} - T^P_{R,fur})$ corresponds to a circumferential time shift of the blade tip that is caused by a displacement, $\Delta_{ax}$, of the blade tip in the axial direction X, as shown schematically in FIG. 6. This displacement is calculated from the expression:

$$\Delta_{ax} = (2\pi R \Delta t_{cts})/(\omega_{fur} \tan(\theta_{fur}))$$

Thus from relatively nonintrusive and simple instrumentation, i.e. two BTT probes and an OPR probe, blade tip axial displacements can be measured.

The method can be repeated for other revolutions so that the development of blade tip axial displacement can be followed or plotted. Likewise, the method can be repeated for other blades of the row of blades. The method is also suitable for obtaining measurements in real time.

The method can be used for model validation (e.g. finite element model validation), BTT calibration, and also for characterisation of surge, stall and flutter events.

Figure 7:
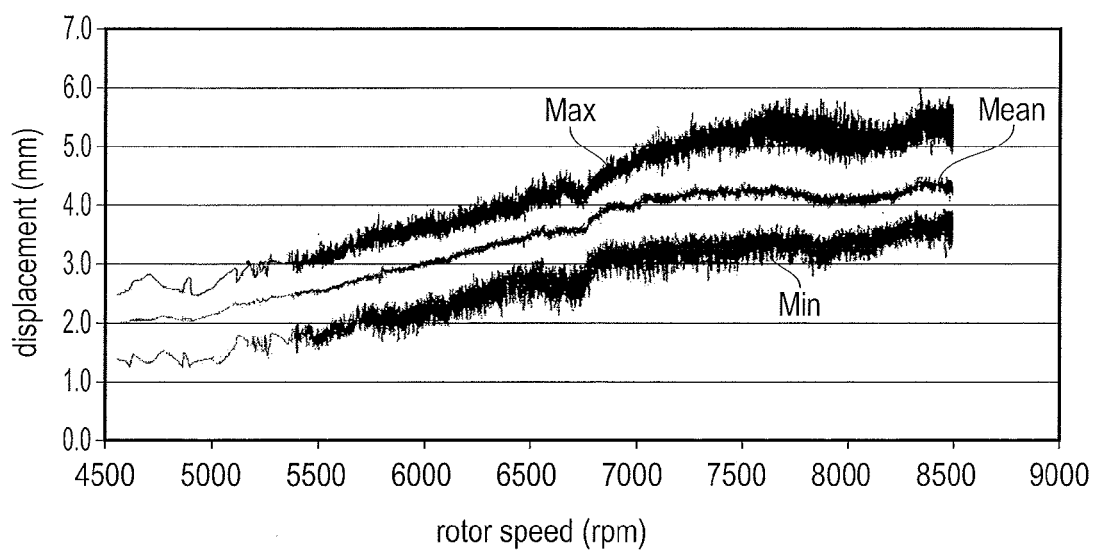
FIG. 7 shows plots of measured blade tip axial displacement against rotor speed.

FIG. 7 shows plots of blade tip axial displacement against rotor speed, the displacement being measured according to the above method for all blades of a row of blades. The upper plot shows the maximum displacement of the blades, the middle plot shows the mean displacement of the blades, and the bottom plot shows the minimum displacement of the blades.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A method of measuring the position of the blade stagger angle axis for one or more blades of a row of blades attached to a rotor, the method comprising the steps of:

during rotation of the rotor, obtaining forward and rearward blade tip timing datasets for successive rotations of the blades from two axially spaced blade tip timing probes, a forward one of the blade tip timing probes being forward of a rearward one of the probes along the axial direction of the rotor, the forward and reward blade tip timing datasets allowing times of arrival of the blades at the respective probes to be measured;

during rotation of the rotor, obtaining a once per revolution dataset for said successive rotations of the blades, the once per revolution dataset allowing angular velocity of the blades to be measured;

determining, from the forward and rearward blade tip timing datasets, measured blade tip times of arrival at the forward and rearward probes of a blade for a reference revolution of the blades;

determining, from the once per revolution dataset, predicted blade tip times of arrival at the forward and rearward probes of the blade for a further revolution of the blades assuming that there is no change in shape or relative position of the blade;

determining, from the forward and rearward blade tip timing datasets, measured blade tip times of arrival at the forward and rearward probes of the blade for said further revolution of the blades;

calculating the position of the blade stagger angle axis of the blade at said further revolution from the expression:

$$D_{FA} = D_{FR}(\Delta_F/(\Delta_F + \Delta_R))$$

or from the expression:

$$D_{RA} = D_{FR}(\Delta_R/(\Delta_F + \Delta_R))$$

where $D_{FA}$ is the distance along the axial direction of the rotor between the forward probe and the position of the blade stagger angle axis, $D_{RA}$ is the distance along the axial direction of the rotor between the rearward probe and the position of the blade stagger angle axis, $D_{FR}$ is the distance along the axial direction of the rotor between the forward probe and the rearward probe, $\Delta_F$ is the difference between the measured blade tip time of arrival of the blade at the forward probe and the predicted blade tip time of arrival of the blade at the forward probe for said further revolution, and $\Delta_R$ is the difference between the measured blade tip time of arrival of the blade at the rearward probe and the predicted blade tip time of arrival of the blade at the rearward probe for said further revolution; and performing a blade tip timing calibration based upon the calculated position of the blade stagger angle axis of the blade.

2. A method of measuring the blade tip stagger angle for one or more blades of a row of blades attached to a rotor, the method comprising the steps of:

during rotation of the rotor, obtaining forward and rearward blade tip timing datasets for successive rotations of the blades from two axially spaced blade tip timing probes, a forward one of the blade tip timing probes being forward of a rearward one of the probes along the axial direction of the rotor, the forward and reward blade tip timing datasets allowing times of arrival of the blades at the respective probes to be measured;

during rotation of the rotor, obtaining a once per revolution dataset for said successive rotations of the blades, the once per revolution dataset allowing angular velocity of the blades to be measured;

determining, from the forward and rearward blade tip timing datasets, measured blade tip times of arrival at the forward and rearward probes of a blade for a revolution of the blades;

calculating the blade tip stagger angle of the blade at said revolution from the expressions:

$$\theta = a\tan((R((\alpha_F-\alpha_R)-\Delta_\alpha))/D_{FR})$$

and $$\Delta_\alpha = \omega(T^m{}_F - T^m{}_R)$$

where $\theta$ is the blade tip stagger angle of the blade at said revolution, $D_{FR}$ is the distance along the axial direction of the rotor between the forward probe and the rearward probe, R is the radial distance from the tip of the blades to the axis of the rotor, $\alpha_F$ is the angular position of the forward probe, $\alpha_R$ is the angular position of the rearward probe, $\omega$ is the measured angular velocity of the blades at said revolution, $T^m{}_F$ is the measured blade tip time of arrival of the blade at the forward probe at said revolution, and $T^m{}_R$ is the measured blade tip time of arrival of the blade at the rearward probe at said revolution; and performing a blade tip timing calibration based upon the calculated blade tip stagger angle of the blade.

3. A method of measuring the blade tip axial displacement for one or more blades of a row of blades attached to a rotor, the method comprising the steps of:

during rotation of the rotor, obtaining forward and rearward blade tip timing datasets for successive rotations of the blades from two axially spaced blade tip timing probes, a forward one of the blade tip timing probes being forward of a rearward one of the probes along the axial direction of the rotor, the forward and reward blade tip timing datasets allowing times of arrival of the blades at the respective probes to be measured;

during rotation of the rotor, obtaining a once per revolution dataset for said successive rotations of the blades, the once per revolution dataset allowing angular velocity of the blades to be measured;

determining, from the forward and rearward blade tip timing datasets, measured blade tip times of arrival at the forward and rearward probes of a blade for a reference revolution of the blades;

determining, from the once per revolution dataset, predicted blade tip times of arrival at the forward and rearward probes of the blade for a further revolution of the blades assuming that there is no change in shape or relative position of the blade;

determining, from the forward and rearward blade tip timing datasets, measured blade tip times of arrival at the forward and rearward probes of the blade for said further revolution of the blades;

calculating the position of the blade stagger angle axis of the blade at said further revolution from the expression:

$$D_{FA} = D_{FR}(\Delta_F/(\Delta_F+\Delta_R))$$

or from the expression:

$$D_{RA} = D_{FR}(\Delta_R/(\Delta_F+\Delta_R))$$

where $D_{FA}$ is the distance along the axial direction of the rotor between the forward probe and the position of the blade stagger angle axis, $D_{RA}$ is the distance along the axial direction of the rotor between the rearward probe and the position of the blade stagger angle axis, $D_{FR}$ is the distance along the axial direction of the rotor between the forward probe and the rearward probe, $\Delta_F$ is the difference between the measured blade tip time of arrival of the blade at the forward probe and the predicted blade tip time of arrival of the blade at the forward probe for said further revolution, and $\Delta_R$ is the difference between the measured blade tip time of arrival of the blade at the rearward probe and the predicted blade tip time of arrival of the blade at the rearward probe for said further revolution;

calculating the blade tip stagger angle of the blade for each of a reference and further revolutions from the expressions:

$$\theta = a\tan((R((\alpha_F-\alpha_R)-\Delta_\alpha))/D_{FR})$$

and $$\Delta_\alpha = \omega(T^m{}_F - T^m{}_R)$$

where $\theta$ is the blade tip stagger angle of the blade at each revolution, $D_{FR}$ is the distance along the axial direction of the rotor between the forward probe and the rearward probe, R is the radial distance from the tip of the blades to the axis of the rotor, $\alpha_F$ is the angular position of the forward probe, $\alpha_R$ is the angular position of the rearward probe, $\omega$ is the measured angular velocity of the blades at each revolution, $T^m{}_F$ is the measured blade tip time of arrival of the blade at the forward probe at each revolution, and $T^m{}_R$ is the measured blade tip time of arrival of the blade at the rearward probe at each revolution;

determining updated predicted blade tip times of arrival at the forward and rearward probes of the blade for said further revolution from the expressions:

$$T^P{}_{F,fur} = T^m{}_{F,ref}\omega_{ref}/\omega_{fur} - D_{FA,fur}(\tan(\theta_{fur})-\tan(\theta_{ref}))/(R\omega_{fur})$$

and $$T^P{}_{R,fur} = T^m{}_{R,ref}\omega_{ref}/\omega_{fur} + D_{RA,fur}(\tan(\theta_{fur})-\tan(\theta_{ref}))/(R\omega_{fur})$$

where $T^P{}_{F,fur}$ and $T^P{}_{R,fur}$ are updated predicted blade tip times of arrival of the blade at respectively the forward and rearward probes at said further revolution and relative to the start of said further revolution, $T^m{}_{F,ref}$ and $T^m{}_{R,ref}$ are the measured blade tip times of arrival of the blade at respectively the forward and rearward probes at said reference revolution and relative to the start of said reference revolution, $\omega_{ref}$ and $\omega_{fur}$ are the measured angular velocities of the blades at respectively said reference revolution and said further revolution, $D_{FA,fur}$ and $D_{RA,fur}$ are the distances along the axial direction of the rotor between respectively the forward probe and the position of the blade stagger angle axis of the blade and the rearward probe and the position of the blade stagger angle axis of the blade at said further revolution, and $\theta_{ref}$ and $\theta_{fur}$ are the blade tip stagger angles of the blade at respectively said reference revolution and said further revolution; and determining the blade tip axial displacement at said further revolution relative to the blade tip axial position at said reference revolution from the expressions:

$$\Delta_{ax} = (2\pi R\Delta t_{cts})/(\omega_{fur}\tan(\theta_{fur}))$$

and $$\Delta t_{cts} = (T^m{}_{F,fur} - T^P{}_{F,fur}) - (T^m{}_{R,fur} - T^P{}_{R,fur})$$

where $\Delta_{ax}$ is the blade tip axial displacement at said further revolution relative to the blade tip axial position at said reference revolution, and $T^m{}_{F,fur}$ and $T^m{}_{R,fur}$ are the measured times of arrival of the blade at respectively the forward and rearward probes at said further revolution and relative to the start of said further revolution; and performing a blade tip timing calibration based upon the calculated blade tip axial displacement of the blade.

4. The method of claim 1 further including an initial step of generating the forward and rearward blade tip timing datasets and the once per revolution dataset.

5. The method of claim 2 further including an initial step of generating the forward and rearward blade tip timing datasets and the once per revolution dataset.

6. The method of claim 3 further including an initial step of generating the forward and rearward blade tip timing datasets and the once per revolution dataset.

7. The method of claim 1, wherein the blades are fan blades.

8. The method of claim 1, further comprising the step of locating the forward probe at a position which is swept by the leading edges of the blades.

9. The method of claim 1, further comprising the step of locating the rearward probe at a position which is swept by the trailing edges of the blades.

10. The method of claim 1, further comprising the steps of:
implementing a computer model of the blades in motion;
compiling computer modelled blade tip timing datasets for at least a first revolution of the blades; and
validating the computer model of the blades by comparison of the computer modelled blade tip timing datasets to said forward and rearward blade tip timing datasets.

11. The method of claim 2, further comprising the steps of:
implementing a computer model of the blades in motion;
compiling computer modelled blade tip timing datasets for at least a first revolution of the blades; and
validating the computer model of the blades by comparison of the computer modelled blade tip timing datasets to said forward and rearward blade tip timing datasets.

12. The method of claim 3, further comprising the steps of:
implementing a computer model of the blades in motion;
compiling computer modelled blade tip timing datasets for at least a first revolution of the blades; and
validating the computer model of the blades by comparison of the computer modelled blade tip timing datasets to said forward and rearward blade tip timing datasets.

13. The method of claim 1, further comprising the steps of:
implementing a computer model of the blades in motion;
compiling computer modelled blade tip timing datasets for at least a first revolution of the blades; and
calibrating the computer model of the blades by comparison of the computer modelled blade tip timing datasets to said forward and rearward blade tip timing datasets.

14. The method of claim 2, further comprising the steps of:
implementing a computer model of the blades in motion;
compiling computer modelled blade tip timing datasets for at least a first revolution of the blades; and
calibrating the computer model of the blades by comparison of the computer modelled blade tip timing datasets to said forward and rearward blade tip timing datasets.

15. The method of claim 3, further comprising the steps of:
implementing a computer model of the blades in motion;
compiling computer modelled blade tip timing datasets for at least a first revolution of the blades; and
calibrating the computer model of the blades by comparison of the computer modelled blade tip timing datasets to said forward and rearward blade tip timing datasets.

16. The method of claim 1 wherein said forward and reward blade tip timing datasets contain signals indicative of events selected from the group consisting of surge, stall and flutter.

17. The method of claim 2 wherein said forward and reward blade tip timing datasets contain signals indicative of events selected from the group consisting of surge, stall and flutter.

18. The method of claim 3 wherein said forward and reward blade tip timing datasets contain signals indicative of events selected from the group consisting of surge, stall and flutter.

19. A computer configured by a program to perform the method of claim 1.

20. A computer configured by a program to perform the method of claim 2.

21. A computer configured by a program to perform the method of claim 3.

22. A non-transitory computer readable storage medium encoded with a program for configuring a computer to perform the method of claim 1.

23. A non-transitory computer readable storage medium encoded with a program for configuring a computer to perform the method of claim 2.

24. A non-transitory computer readable storage medium encoded with a program for configuring a computer to perform the method of claim 3.

* * * * *